United States Patent
Varadarajan

(10) Patent No.: US 7,451,427 B2
(45) Date of Patent: Nov. 11, 2008

(54) BUS REPRESENTATION FOR EFFICIENT PHYSICAL SYNTHESIS OF INTEGRATED CIRCUIT DESIGNS

(75) Inventor: Ravi Varadarajan, Fremont, CA (US)

(73) Assignee: Atrenta, Inc., San Jose, CA (US)

( * ) Notice: Subject to any disclaimer, the term of this patent is extended or adjusted under 35 U.S.C. 154(b) by 211 days.

(21) Appl. No.: 11/423,919

(22) Filed: Jun. 13, 2006

(65) Prior Publication Data

US 2006/0282800 A1    Dec. 14, 2006

Related U.S. Application Data

(60) Provisional application No. 60/689,545, filed on Jun. 13, 2005.

(51) Int. Cl.
*G06F 17/50* (2006.01)

(52) U.S. Cl. ............ 716/18; 716/1; 716/2; 716/9; 716/10

(58) Field of Classification Search ............. 716/1, 716/2, 8, 9, 10, 18
See application file for complete search history.

(56) References Cited

U.S. PATENT DOCUMENTS

| | | | | |
|---|---|---|---|---|
| 4,122,520 | A * | 10/1978 | Adamchick et al. | 710/25 |
| 5,572,437 | A * | 11/1996 | Rostoker et al. | 716/18 |
| 6,009,251 | A * | 12/1999 | Ho et al. | 716/5 |
| 6,145,117 | A * | 11/2000 | Eng | 716/18 |
| 6,272,665 | B1 * | 8/2001 | Johnson et al. | 716/3 |
| 6,516,456 | B1 * | 2/2003 | Garnett et al. | 716/8 |
| 6,684,376 | B1 * | 1/2004 | Kerzman et al. | 716/8 |

* cited by examiner

*Primary Examiner*—Sun J Lin
(74) *Attorney, Agent, or Firm*—Sughrue Mion, PLLC

(57) ABSTRACT

A method for the abstraction of connectivity that provides an intermediate data path representation of integrated circuit (IC) designs is provided. The connectivity abstraction maintains the compactness of a bus level representation as well as the uniqueness of a bit level representation. Connectivity abstraction significantly reduces network complexity, i.e., the number of wires in a design and the execution time of physical synthesis of IC designs.

19 Claims, 5 Drawing Sheets

BUS REPRESENTATION FOR EFFICIENT PHYSICAL SYNTHESIS OF INTEGRATED CIRCUIT DESIGNS

CROSS REFERENCE TO RELATED APPLICATIONS

This application claims priority from a U.S. provisional application 60/689,545 filed on Jun. 13, 2005, and incorporates herein the content with reference thereto.

TECHNICAL FIELD

The present invention relates generally to methods and systems for efficient physical synthesis of integrated circuit (IC) designs, and more particularity to a method for creating optimized connectivity representations from register transfer level (RTL) descriptions.

BACKGROUND OF THE INVENTION

State of the art electronic design automation (EDA) systems for designing complex integrated circuits (ICs) involves the use of several software tools for the creation and verification of designs of such circuits. Presently, EDA systems implement a design process commonly known as the top-down design methodology. This methodology is an iterative process that includes the processing steps of logic synthesis, floor planning, place and route, parasitic extraction, and timing optimization.

The start point of a typical top-down design flow is a register transfer level (RTL) description of a circuit. The RTL description provides a functional view of an IC design expressed in a hardware description language (HDL). This design is coupled with various design goals, such as the overall operating frequency of the IC, circuit area, power consumption, and the like. The RTL description (or model) is manually partitioned by a designer into various functional blocks that together represent the functional and architectural characteristics of the design. The functional blocks are then converted by logic synthesis tools into detailed gate level netlists. A synthesis tool further determines the timing constraints based on statistical and placement-based wire-load estimation models and pre-characterized cell libraries for the process technology to be used when physically implementing the IC. The gate-level netlist and timing constraints are then used to create a floor-plan of the circuit. Thereafter, blocks are placed and routed by place-and-route tools to create the physical layout.

Presently, the complexity of IC designs overwhelms the capability of logic synthesis tools. For example, the synthesis execution time of a typical IC containing only tens of thousands of logic gates is typically on the order of days.

Most RTL synthesis tools provide two levels of connectivity representation: 1) a bus level and 2) a bit level. The bit level representation is equivalent to wire connections and the objects of this representation are bit nets and bit pins. The bit pins may be either cell pins or inst-pins. In integrated circuit design, pins refer to a way of representing interconnects such as actual pins and/or wires. The cell pins are used to link between cells and inst-pins are for connecting nets. The bus level representation is equivalent to the source RTL. The objects of this representation, in addition to the bit nets and bit pins, are multi-bit nets (or busses) and multi-bit pins. The bit level representation can be generated from a given bus level representation. The bus representation is used solely for generating HDL code and for schematic display purposes. The bit level representation is used in tasks executed to optimization and analysis tools, such partitioning, restructuring, sizing, global placement, routing, and so on.

FIG. 1 schematically shows the difference between the bit and bus level representations, both being compliant with the following RTL description.

module inv (out, in)
       output[7:0] out;
       input[7:0] in;
       out=~in;
    end module FIG. 1A depicts a bus level representation of the above 'inv' module that includes two multi-bit nets 110 and 120, respectively associated with the 'in' and 'out' busses. The equivalent bit level representation depicted in FIG. 1B includes 16 bit nets, where nets 130-0 through 130-7 represent wires of the 'in' bus and nets 130-8 through 130-15 are wires of the 'out' bus. In fact, a bit level netlist for the above module includes 16 nets, 16 inst-pins and 16 cell pins.

As can be noted, the bit level representation increases the network complexity, i.e., the number of wires in the netlist. In general, the bus representation is the most compact representation, but it does not explicitly capture the connectivity. Therefore, traversing of a bus level netlist by optimization and analysis tools is inefficient and error prone. On the other hand, a bit level netlist explicitly captures the connectivity, thus making traversals efficient. However, this representation is complex and incomprehensible to an IC designer.

Therefore, in view of the limitations of the prior art, it would be advantageous to provide a connectivity abstraction method that maintains the compactness of a bus level representation while ensuring the explicit connectivity capture of a bit level representation.

DETAILED DESCRIPTION OF THE INVENTION

The present invention discloses a method for connectivity abstraction. The method of connectivity abstraction enables an intermediate representation that maintains the compactness of a bus level representation as well as the uniqueness of the bit level representation. The disclosed connectivity abstraction significantly reduces the network complexity and the execution time of physical synthesis of integrated circuit (IC) designs.

Generally, an IC design can be considered as a multi-bit datapath that transforms an input signal to a design signal using multi-bit control signals, i.e., control or data buses. Logic components, such as data operators, use buses as their inputs and outputs. A bus may be connected to a logic component in its entirety, or the bus may be split to handle multiple logical components. In the latter case, some of the bits are connected to a single logic component and the rest are connected to one or more different logic components. According to an exemplary embodiment of the present invention, a multi-bit bus is considered as a decomposed set or subset of bits that share the same pattern. These sets or subsets may be commonly referred to hereinafter as "lowest common-connectivity denominators (LCCD) nets".

A LCCD net may include the entire bus if all bits of a multi-bit bus share the same pattern. A pattern may be a customary way of connectivity, constraints, functionality, and so on. On the other hand, a LCCD net may also include only one bit if all bits of a bus are split such that no bit shares the same pattern. However, the typical case is where a LCCD net is a multi-bit subset of a bus having a common pattern. The LCCD net is derivable as there is no one-to-one mapping from a bus net or a bit net to a LCCD net. That is, a bus can be split into one or more LCCD nets, and multiple bit nets may belong to the same LCCD net. The various types of LCCD nets are shown in FIGS. 2 and 3.

The objects making up a LCCD net and bit net are alike, i.e., a LCCD net has a unique set of LCCD pins. LCCD pins may be one of cell pins, inst-pins, or pin ranges. A LCCD pin range represents the portion of a bus pin that is connected to a LCCD net and it may be either a LCCD cell pin range or a LCCD inst-pin range. A pin range consists of the underlying pin, i.e., cell pin or inst-pin and indication including the least significant bit (LSB) and the most significant bit (MSB) of that pin.

Figure 1A:
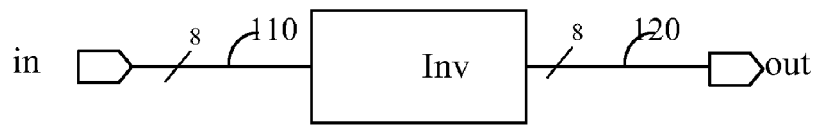
FIGS. 1a and 1b are schematic diagrams showing the difference between a bit and bus level representation.
Figure 1B:
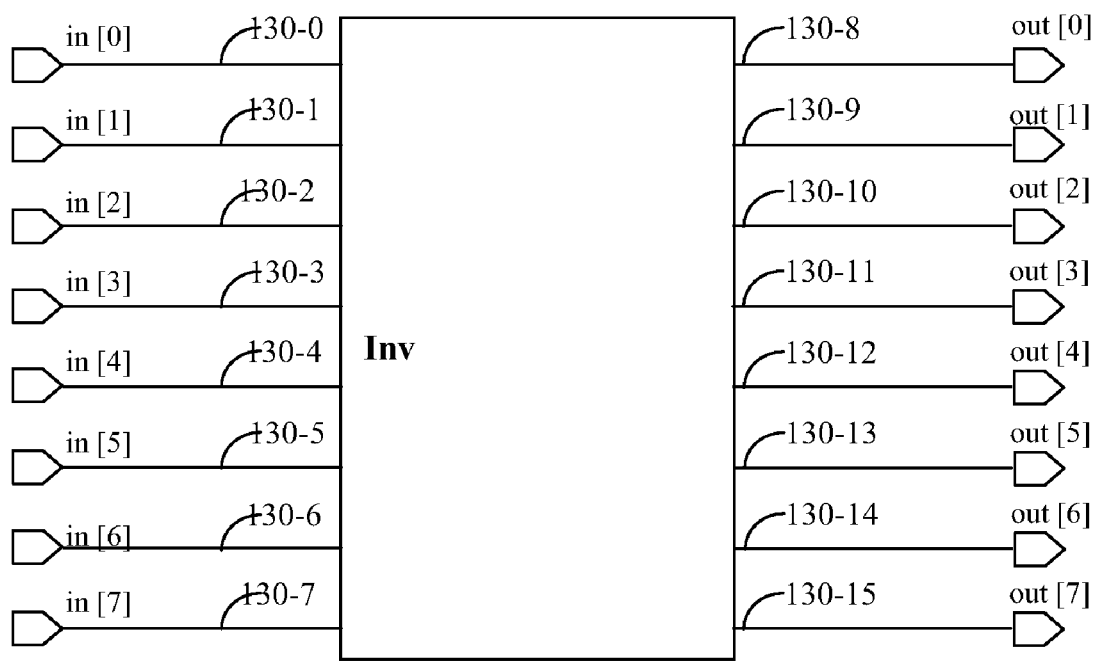
Figure 2:
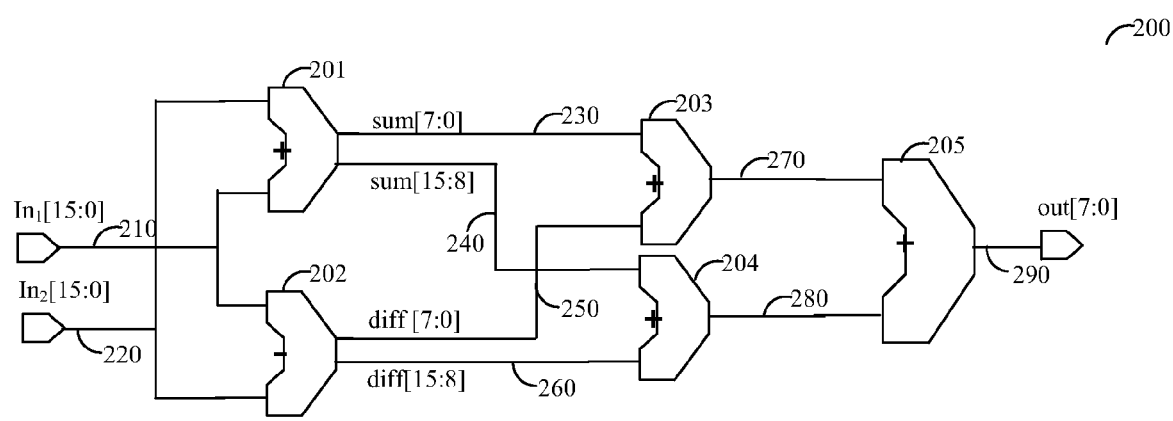
FIG. 2 is a diagram of a schematic LCCD representation generated from a RTL description.
Figure 3:
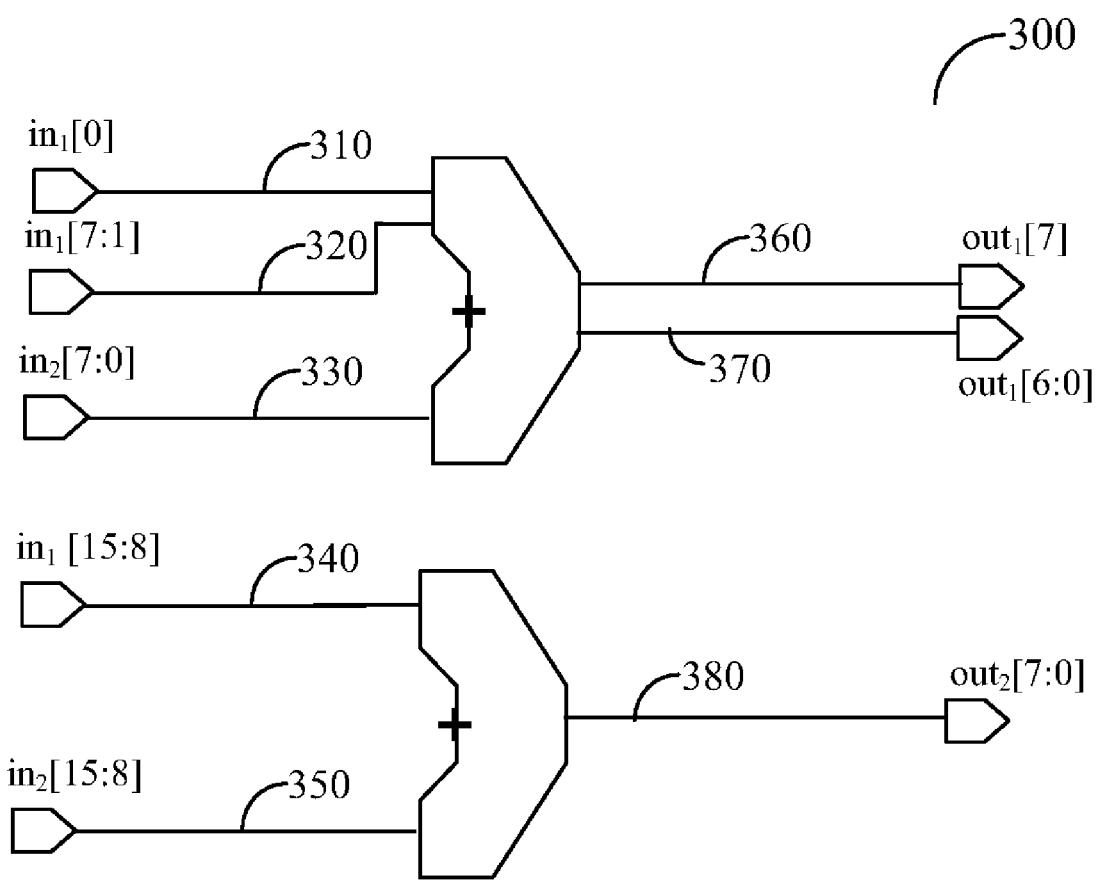
FIG. 3 is a diagram of a schematic LCCD representation generated from a RTL description and timing constraints.

FIG. 2 shows an exemplary and non-limiting schematic of a LCCD representation 200 that includes LCCD nets constructed in accordance with an exemplary embodiment of the present invention. The schematic representation 200 is compliant with the following exemplary RTL description:

```
module AddDiff(in₁, in₂, out)
    output[7:0] out;
    input[15:0] in₁;
    input[15:0] in₂;
    add(sum, in₁, in₂);
    sub(diff, in₁, in₂);
    add(out₁, sum[7:0], diff[7:0]);
    add(out₂, sum[15:8], diff[15:8]);
    out = out₁ + out₂;
end module
```

Circuit 200 includes nine LCCD nets 210 through 290. LCCD nets 210, 220, 270, 280, and 290 being respectively related to buses 'in$_1$', 'in$_2$', 'out$_1$', 'out$_2$', and 'out'. Each of these nets includes all bits of the respective bus. LCCD nets 230, 240, 250, and 260 are associated with buses 'sum' and 'diff'. Particularly, each of these nets includes a subset of bits of the respective bus, namely LCCD nets 230 and 240 respectively hold the eight (8) LSBs and MSBs of the 'sum' bus. Likewise, LCCD nets 250 and 260 respectively hold the eight (8) LSBs and MSBs of the 'diff' bus. A netlist generated by a synthesis tool for the above LCCD representation would include only five LCCD pins and four LCCD pin ranges.

It should be noted by a person skilled in the art that a bit level netlist generated from the above RTL description would include at least 88 bit nets, 88 cell pins and 88 inst-pins. The number of bit nets is equal to the number of buses (7) multiplied by the number of bits in each bus (16). Furthermore, a schematic view generated for such a bit level representation is "bit-blasted" and cannot help an IC designer in understanding or debugging the design.

As mentioned above one of the parameters for bundling bits into a LCCD net is constraints, and specifically timing constraints. In IC design, every path that originates from either an input port or a register clock pin, must be properly constrained to obtain correct implementation of the RTL design. Typically, timing constraints are applied mainly to achieve the following: 1) describing the different attributes of clock signals, such as duty cycle, clock skew, and clock latency; 2) specifying input and output delay requirements of ports relative to a clock transition; and, 3) setting up timing exceptions. The present invention represents a bit or a subset of bits with a common timing constraint in a single LCCD net.

As a non-limiting example, FIG. 3 shows a schematic LCCD representation 300 that includes LCCD nets constructed in accordance with one exemplary embodiment of the present invention. The LCCD representation 300 is generated for the following RTL description and timing constraints specified below.

```
module Add(in₁, in₂, out₁, out₂)
    input clk;
    output[7:0] out1;
    output[7:0] out2;
    input[15:0] in₁;
    input[15:0] in₂;
    out₁ = in₁[7:0] + in₂[7:0];
    out₂ = in₁[15:8] + in₂[15:8];
end module
```

The timing constraints set in this example determines that buses 'in$_1$', 'in$_2$', 'out$_1$' and 'out$_2$' are clocked by the clock 'Clk'. Furthermore, it is constrained that the input delay of bit in$_1$[0] is 2 nanosecond (ns) and the output delay of out$_1$[7] is also 2 ns. The timing constraints are set by the user in a constraint file compliant with the synthesizer. The timing constraints include at least an input arrival time, an output required time, and a delay time of the bus.

Circuit 300 includes eight LCCD nets 310 through 380. LCCD nets 310, 320, and 330 are subsets of bus 'in$_1$'. LCCD net 310 represents the constraint applied on bit in$_1$[0] of bus in$_1$ and includes only this bit. LCCD nets 340 and 350 are subsets of bus 'in$_2$' each includes 8 bits. LCCD nets 360 and 370 are subsets of bus 'out$_1$', where net 370 represents the constraint applied on bit out$_1$[7] of bus out$_1$. LCCD net 370 includes all bits of bus 'out$_2$'. As demonstrated in this example, a LCCD net may include a single bit (e.g., net 310) and a subset of bits of a bus (e.g., net 320). It would be appreciated by a person skilled in the art that a bit level representation equivalent to the RTL description and constraints provided above, includes at least 32 bit nets.

As can be noted from the examples respective of FIGS. 2 and 3 above, the LCCD representation disclosed by the present invention reduces the network complexity of an IC design (i.e., the number of wires) by an order of magnitude. It can be further noted that the disclosed representation preserves the compactness of the bus level representation and explicitly captures the design connectivity. Therefore, the LCCD representation can be utilized for efficient physical synthesis, floor-planning, as well as the placement and routing of complex IC designs.

Figure 4:
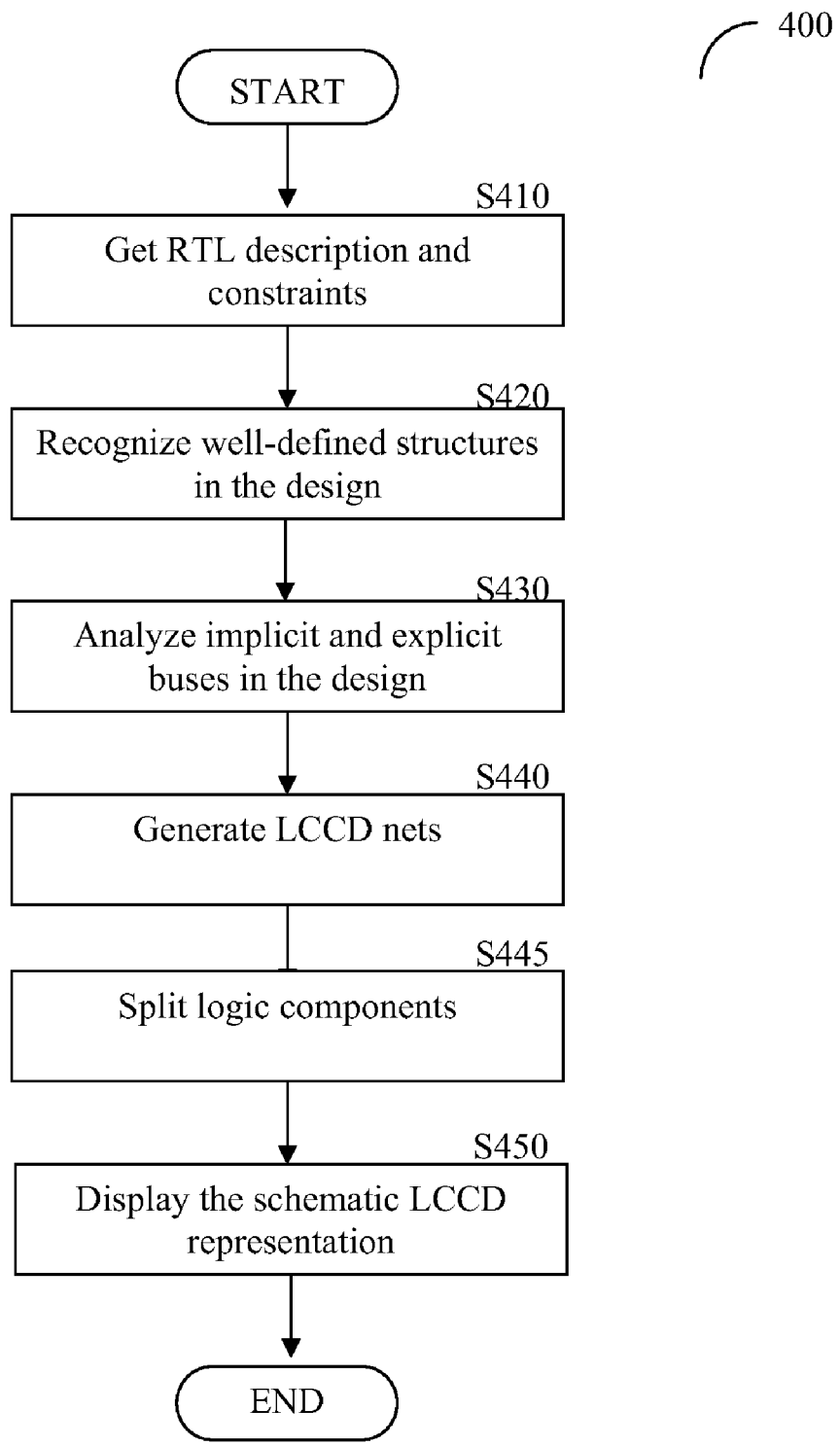
FIG. 4 is a flowchart describing the method for generating a schematic LCCD representation.

Referring to FIG. 4, a non-limiting and exemplary flowchart 400 describing the method for generating a schematic LCCD representation in accordance with an exemplary embodiment of the present invention is shown. At step S410, an input is received that provides for the RTL description and constraints set for the design.

The design may be of an IC, part of an IC, or multiple ICs on a circuit board. The RTL description describes the function of the IC using a HDL such as Verilog or VHDL. The RTL description may be either directly written by an IC designer, or generated from a behavioral model using behavioral synthesis. In addition, the RTL description may be extracted directly from internal data structures (libraries) of a behavioral model without undergoing RTL construction. The constraints are set by the IC designer. At step S420, the RTL description is processed in order to recognize well-defined structures, such as latch inferences, 'case' constructs, 'if' constructs, assignments, and expressions. At step S430, all implicit buses in a bit level representation and explicit buses in the input RTL description are analyzed for the purposes of creating LCCD nets. At step S440 LCCD nets are generated.

Figure 5:
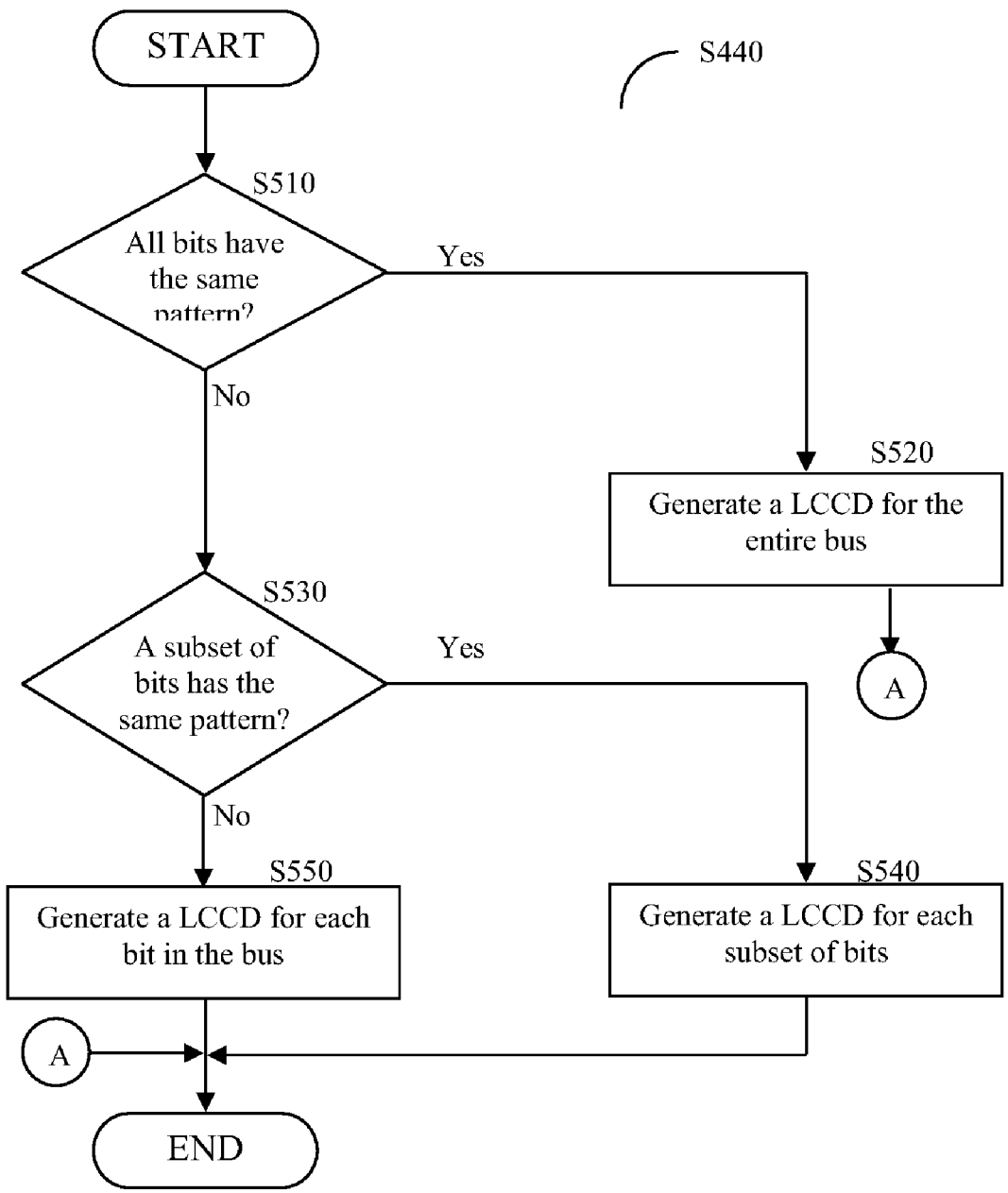
FIG. 5 is a flowchart describing the process for generating LCCD nets.

Referring to FIG. 5, the execution of step S440 is shown. At step S510, for each multi-bit bus in the RTL description it is determined if all bits of the bus can be bundled based on their mutual pattern, i.e., connectivity, functionality, and constraints. If so, at step S520 a LCCD net that includes all bits of the bus is created; otherwise, at step S530 it is checked whether a subset of the multi-bit bus that includes at least two bits, share a similar pattern. If step S530 results in an affirmative answer, then at step S540 a single LCCD net is created for each such subset. If step S530 results in a negative answer, at step S550, a LCCD net is generated for each bit in the multi-bit bus.

Referring back to FIG. 4, at step S445, logic components are split based on connectivity determined by the LCCD nets. For example, an eight-bit bus connected to an AND logic gate is represented by two LCCD nets: a first LCCD net may include the four MSBs and the second LCCD net may include the four LSBs. In such a case, the AND gate is split to two AND logic gates, each of which may include either the first or second LCCD net. At step S450 a schematic LCCD representation including the identified structures and generated LCCD nets is presented to the designer. The resultant LCCD representation can be further synthesized by a synthesis tool to generate a LCCD based netlist. The LCCD based netlist can be then utilized for efficient floor-planning, placement and routing.

A method is described herein with reference to an exemplary embodiment of the invention, where the LCCD nets are generated from a RTL description. However, other exemplary embodiments will be apparent to those of ordinary skill in the art. For example, the LCCD nets may be generated from a bit level representation in order to form a more compact representation.

The invention may be practiced with a computer having a memory under the control of a processor, the memory having been provided with instructions for enabling the computer to perform the various steps mentioned above. The instructions may be provided by way of a computer program product having a computer readable medium with the instructions, or a form of them, on the medium.

What is claimed is:

1. A computer-generated bus representation that provides an intermediate data path representation of integrated circuit (IC) designs, the computer-generated bus representation comprising: a plurality of lowest common-connectivity denominators (LCCD) nets which are generated from a register transfer level (RTL) description, wherein each of said plurality of LCCD nets comprises at least a subset of bits that share a same pattern; wherein the bus representation maintains compactness of a bus level representation as well as uniqueness of a bit level representation.

2. The computer-generated bus representation of claim 1, wherein said same pattern comprises at least one of a connectivity pattern, a timing constraints pattern, and a functionality pattern.

3. The computer-generated bus representation of claim 2, wherein said timing constraint pattern includes at least one of an input arrival time, an output required time, and a delay time.

4. The computer-generated bus representation of claim 3, wherein said subset of bits belongs to a multi-bit bus.

5. The computer-generated bus representation of claim 4, wherein each of said plurality of LCCD nets comprises a unique set of LCCD pins.

6. The computer-generated bus representation of claim 4, wherein said LCCD pins include at least one of: inst-pins, and pin ranges.

7. The computer-generated bus representation of claim 1, wherein said bus representation is utilized to generate a physical layout of an IC design.

8. A computer implemented method for generating a unique bus representation from a register transfer level (RTL) description of an integrated circuit (IC) design, comprising: receiving at least the RTL description and constraints set for said IC design; recognizing well-defined structures in said IC design; generating lowest common-connectivity denominators (LCCD) nets; and splitting logic components based on connectivity determined by said LCCD nets.

9. The computer implemented method of claim 8, wherein the generating of LCCD nets comprises: identifying multi-bit buses in the RTL description; in each of identified multi-bit buses, identifying a subset of bits that share a same pattern; and for each identified subset of bits, creating a LCCD net.

10. The computer implemented method of claim 9, wherein said same pattern comprises at least one of: a connectivity pattern, a timing constraints pattern, and a functionality pattern.

11. The computer implemented method of claim 9, wherein said LCCD net comprises a unique set of LCCD pins.

12. The computer implemented method of claim 11, wherein said LCCD pins include at least one of: inst-pins, and pin ranges.

13. The computer implemented method of claim 8, wherein said unique bus representation is utilized to generate a physical layout of the IC design.

14. A computer program product, including a computer readable medium with computer instructions for use by a computer to perform operations for generating a bus representation from a register transfer level (RTL) description of an integrated circuit (IC) design, comprising: receiving at least the RTL description and constraints set for said IC design; recognizing well-defined structures in said IC design; generating lowest common-connectivity denominators (LCCD) nets; and splitting logic components based on connectivity determined by said LCCD nets.

15. The computer program product of claim 14, wherein the generating of LCCD nets comprises: identifying multi-bit buses in the RTL description; in each of identified multi-bit buses identifying a subset of bits that share a same pattern; and for each identified subset of bits, creating a LCCD net.

16. The computer program product of claim 15, wherein said same pattern comprises at least one of: a connectivity pattern, a timing constraints pattern, and a functionality pattern.

17. The computer program product of claim 15, wherein said LCCD net comprises a unique set of LCCD pins.

18. The computer program product of claim 17, wherein said LCCD pins include at least one of: inst-pins, and pin ranges.

19. The computer program product of claim 14, wherein said bus representation is utilized to generate a physical layout of the IC design.

* * * * *